United States Patent
Eo

(10) Patent No.: US 11,495,976 B2
(45) Date of Patent: Nov. 8, 2022

(54) BATTERY SYSTEM AND METHOD FOR CONTROLLING BATTERY SYSTEM

(71) Applicant: SAMSUNG SDI CO., LTD., Yongin-si (KR)

(72) Inventor: Yoonphil Eo, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 179 days.

(21) Appl. No.: 16/927,047

(22) Filed: Jul. 13, 2020

(65) Prior Publication Data
US 2021/0098998 A1   Apr. 1, 2021

(30) Foreign Application Priority Data

Oct. 1, 2019 (KR) .......................... 10-2019-0121750
Feb. 13, 2020 (KR) .......................... 10-2020-0017694

(51) Int. Cl.
| | | |
|---|---|---|
| *H02J 7/00* | (2006.01) | |
| *G01R 31/3835* | (2019.01) | |
| *G01R 31/36* | (2020.01) | |

(52) U.S. Cl.
CPC ........ H02J 7/0014 (2013.01); G01R 31/3648 (2013.01); G01R 31/3835 (2019.01)

(58) Field of Classification Search
CPC .............. H02J 7/0014; G01R 31/3835; G01R 31/3648
USPC .......................................................... 320/116
See application file for complete search history.

(56) References Cited

U.S. PATENT DOCUMENTS

| | | | |
|---|---|---|---|
| 2006/0082343 A1 | 4/2006 | Sobue et al. | |
| 2013/0076309 A1 | 3/2013 | Nork et al. | |
| 2014/0015488 A1* | 1/2014 | Despesse | H02J 7/007 429/7 |
| 2014/0077765 A1* | 3/2014 | Gao | H02J 7/00 320/126 |
| 2014/0084867 A1* | 3/2014 | Hamaoka | H02J 7/0016 320/136 |
| 2014/0218042 A1* | 8/2014 | Koba | G01R 31/367 324/430 |

(Continued)

FOREIGN PATENT DOCUMENTS

| | | | | |
|---|---|---|---|---|
| EP | 2495802 A2 * | 9/2012 | .......... | H01M 10/425 |
| EP | 2859642 B1 | 1/2019 | | |

(Continued)

OTHER PUBLICATIONS

Koseoglou, "Highly Effective Cell Equalization in a Lithium-Ion Battery Management System", Jun. 2019, IEEE Transactions on Power Electronics, pp. 2088-2099 (Year: 2019).*
Korean Office action dated Jun. 3, 2021.

(Continued)

Primary Examiner — Suresh Memula
(74) Attorney, Agent, or Firm — Lee IP Law, P.C.

(57) ABSTRACT

A battery system includes a battery module that includes a plurality of battery cells, a monitoring unit configured to monitor a parameter of each of the battery cells, and a control unit configured to determine whether there is an abnormal battery cell in the battery module using the parameter, to calculate a reference voltage for balancing the battery cells when it is determined that there is an abnormal battery cell in the battery module, and to control cell balancing of the battery cells to an equalization target range.

20 Claims, 30 Drawing Sheets

(56) References Cited

U.S. PATENT DOCUMENTS

| | | | | |
|---|---|---|---|---|
| 2015/0077124 | A1* | 3/2015 | Suzuki | H02J 7/0036 |
| | | | | 324/426 |
| 2016/0276847 | A1 | 9/2016 | Kang et al. | |
| 2017/0373520 | A1 | 12/2017 | Sugeno et al. | |
| 2021/0218262 | A1* | 7/2021 | Bae | H02J 7/007184 |
| 2021/0286017 | A1* | 9/2021 | Hom | G01R 31/392 |

FOREIGN PATENT DOCUMENTS

| | | | | |
|---|---|---|---|---|
| EP | 3680955 A1 * | 7/2020 | | B60L 3/0084 |
| EP | 2700965 B1 * | 10/2020 | | G01R 31/3835 |
| EP | 3839533 A1 * | 6/2021 | | G01R 31/374 |
| EP | 3876384 A1 * | 9/2021 | | G01R 27/08 |
| JP | 2006-121776 A | 5/2006 | | |
| JP | 2018-57129 A | 4/2018 | | |
| KR | 10-2012-0138707 A | 12/2012 | | |
| KR | 10-1619268 B1 | 5/2016 | | |
| KR | 10-1660883 B1 | 9/2016 | | |
| WO | WO-2012117113 A1 * | 9/2012 | | B60L 11/005 |
| WO | WO-2013094057 A1 * | 6/2013 | | B60L 3/003 |
| WO | WO-2014042740 A2 * | 3/2014 | | H02J 7/00 |
| WO | WO 2016-132414 A1 | 8/2016 | | |
| WO | WO-2020105303 A1 * | 5/2020 | | B60L 58/22 |
| WO | WO-2021183648 A1 * | 9/2021 | | G01R 31/367 |

OTHER PUBLICATIONS

Koseoglou, Markos, et al., "Highly Effective Cell Equalization in a Lithium-Ion Battery Management System", IEEE Transactions on Power Electronics, vol. 35, No. 2, Feb. 2019, pp. 2088-2099.
Extended European Search Report dated Feb. 22, 2021.

* cited by examiner (a)

(b)

BATTERY SYSTEM AND METHOD FOR CONTROLLING BATTERY SYSTEM

CROSS-REFERENCE TO RELATED APPLICATION

Korean Patent Application No. 10-2019-0121750, filed on Oct. 1, 2019, in the Korean Intellectual Property Office, and Korean Patent Application No. 10-2020-0017694, filed on Feb. 13, 2020, in the Korean Intellectual Property Office, both entitled: "Battery System and Method for Controlling Battery System," are incorporated by reference herein in their entirety.

BACKGROUND

1. Field

Embodiments relate to a battery system and a control method of the battery system.

2. Description of the Related Art

A rechargeable battery differs from a primary battery in that charging and discharging can be repeated, whereas the primary battery provides non-reversible conversion from chemical energy to electrical energy. A low-capacity rechargeable battery may be used as a power supply device for small electronic devices such as portable telephones, laptops computers, and camcorders, and a high-capacity rechargeable battery may be used as a power supply device for hybrid vehicles and the like.

In general, the rechargeable battery may include an electrode assembly including a positive electrode, a negative electrode, and a separator interposed between the positive electrode and the negative electrode, a case for accommodating the electrode assembly therein, and an electrode terminal electrically connected to the electrode assembly. An electrolyte solution is injected into the case to enable charging and discharging of the battery through an electrochemical reaction of the positive electrode, the negative electrode, and the electrolyte solution. A shape of the case, such as cylindrical or rectangular, may be selected based on an application of the battery.

The rechargeable battery may be used in a battery module including a plurality of unit battery cells connected in series and/or in parallel, thereby providing high energy density for running, e.g., a hybrid vehicle. The battery module may be formed by interconnecting electrode terminals of a plurality of unit battery cells according to an amount of power required to implement a high-power rechargeable battery for an electric vehicle, for example. To configure a battery system, one or more battery modules may be mechanically and electrically integrated, a thermal management system may be mounted, and a setting may be made to communicate with one or more electricity consumers.

The above information disclosed in this Background section is only for enhancement of understanding of the background, and therefore it may contain information that does not form the prior art that is already known in this country to a person of ordinary skill in the art.

SUMMARY

Embodiments are directed to a battery system, including a battery module that includes a plurality of battery cells, a monitoring unit configured to monitor a parameter of each of the battery cells, and a control unit configured to determine whether there is an abnormal battery cell in the battery module using the parameter, to calculate a reference voltage for balancing the battery cells when it is determined that there is an abnormal battery cell in the battery module, and to control cell balancing of the battery cells to an equalization target range.

The abnormal battery cell may be at least one of a weak battery cell, a high-impedance battery cell, and an internal short circuit battery cell.

The equalization target range may be one of a top-balancing range, a mid-balancing range, and a bottom-balancing range.

The control unit may determine whether there is a state of charge shift battery cell in the battery module using a state of charge calculated at two time points.

The control unit may determine whether there is a state of charge shift battery cell in the battery module by comparing an open circuit voltage that is measured during an idle period before charging or discharging with an open circuit voltage that is measured during an idle period after the charging or discharging.

The control unit may calculate capacity of each of the battery cells using the parameter, and may determine whether there is a weak battery cell in the battery module by comparing the capacities.

The control unit may calculate a resistance value of each of the battery cells using the parameter, and may determine whether there is a high-impedance battery cell in the battery module by comparing the resistance values.

The control unit may determine a battery cell having a minimum voltage other than the abnormal battery cell among the battery cells in the battery module as a reserved battery cell, and may calculate the reference voltage using a state of charge difference between the reserved battery cell and the abnormal battery cell in the equalization target range.

The control unit may calculate the reference voltage using the following equations:

$$\Delta SOC_{ref} = (\Delta SOC_r - \Delta SOC_{CBGoal})|_{at\ CB\ Target\ Spot} = (\Delta SOC_r - \Delta SOC_{min\ cell})|_{at\ charge\ cut\text{-}off}$$

$$\Delta V_{ref} = f(\Delta SOC_{ref}),\ \text{and}$$

$$V_{ref} = V_r - \Delta V_{ref}$$

In the equations, $SOC_r$ indicates a state of charge of the reserved battery cell, $SOC_{CBGoal}$ indicates a state of charge of the battery cell having the minimum voltage in the equalization target range, $V_r$ indicates a voltage of the reserved battery cell, and $V_{ref}$ indicates the reference voltage.

The control unit may compensate the reference voltage depending on a time at which the cell balancing is performed.

The control unit may compensate the reference voltage using the following equations:

$$\Delta SOC_{ref} = (SOC_r - SOC_{CBGoal})|_{at\ CB\ Target\ Spot} - \Delta SOC_r|_{by\ cell\ balancing},$$

and $$\Delta SOC_r|_{by\ cell\ balancing} = \frac{I_{CB} \cdot \Delta T_{CB\ On} \cdot \text{duty}_{CB}}{K \cdot Maxcap_r}$$

In the equations, $I_{CB}$ indicates a balancing current, $\Delta T_{CB\ On}$ indicates the time at which the cell balancing is performed, duty$_{CB}$ indicates a duty ratio of the cell balancing, Maxcap$_r$ indicates capacity of the reserved battery cell, and K indicates a constant.

Embodiments are also directed to a method of controlling a battery system, including monitoring a parameter of each of a plurality of battery cells included in a battery module, determining whether there is an abnormal battery cell in the battery module using the parameter, calculating a reference voltage for balancing the battery cells when it is determined that there is an abnormal battery cell in the battery module, and performing cell balancing to an equalization target range using the reference voltage.

The determining of whether there is an abnormal battery cell may include determining whether there is a state of charge shift cell in the battery module using a state of charge calculated at any two time points.

The determining of whether there is an abnormal battery cell may include determining whether there is a state of charge shift cell in the battery module by comparing an open circuit voltage that is measured during an idle period before charging or discharging with an open circuit voltage that is measured during an idle period after the charging or discharging.

The determining of whether there is an abnormal battery cell in the battery module may include calculating a capacity of each of the battery cells in the battery module using the parameter, and determining whether there is a weak battery cell in the battery module by comparing the capacities.

The determining of whether there is an abnormal battery cell in the battery module may include calculating a resistance value of each of the battery cells in the battery module using the parameter, and determining whether there is a high-impedance battery cell in the battery module by comparing the resistance values.

The calculating of the reference voltage may include determining a battery cell having a minimum voltage, other than the abnormal battery cell, among the battery cells in the battery module as a reserved cell, and calculating the reference voltage using a state of charge difference between the reserved battery cell and the abnormal battery cell in the equalization target range.

The method may further include compensating the reference voltage depending on a time at which the cell balancing is performed.

The abnormal battery cell may be at least one of a weak battery cell, a high-impedance battery cell, and an internal short circuit battery cell.

The equalization target range may be one of a top-balancing range, a mid-balancing range, and a bottom-balancing range.

BRIEF DESCRIPTION OF THE DRAWINGS

Features will become apparent to those of skill in the art by describing in detail example embodiments with reference to the attached drawings in which.

DETAILED DESCRIPTION

Figure 1A:
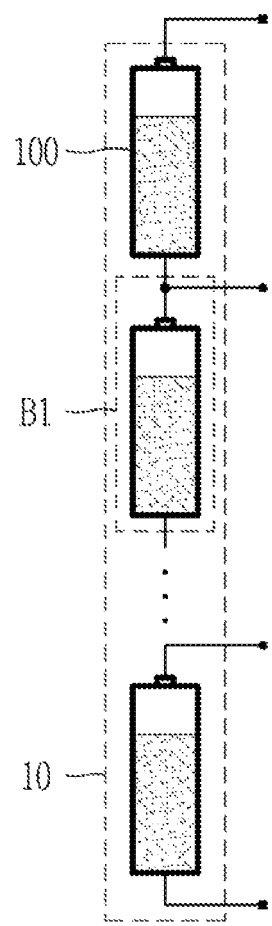
FIG. 1A to FIG. 1C illustrate example views showing cell banks in a battery module.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

As used herein, the term "and/or" includes any and all combinations of one or more related listed items.

In the following description of example embodiments, terms in the singular form may include plural forms unless the context clearly indicates otherwise.

It will be understood that the terms "first" and "second" are used to describe various elements, but these elements should not be limited by these terms. These terms are only used to distinguish one element from another. For example, a first constituent element may be referred to as a second constituent element, and the second constituent element may also be referred to as the first constituent element without departing from the scope of the disclosure. As used herein, the term "and/or" includes any and all combinations of one or more related listed items. An expression such as "at least one" precedes a list of elements, modifying the entire list of elements and not individual elements of the list.

As used in this specification, the terms "substantially", "approximately", and similar terms are used as approximate terms but are not used as degree terms, and they are not intended to illustrate inherent deviations of measured or calculated values evident to those skilled in the art. In addition, when the term "substantially" is used in combination with a characteristic that can be expressed using numerical values, the term "substantially" refers to including a range of +/−5% of the value.

Figure 1B:
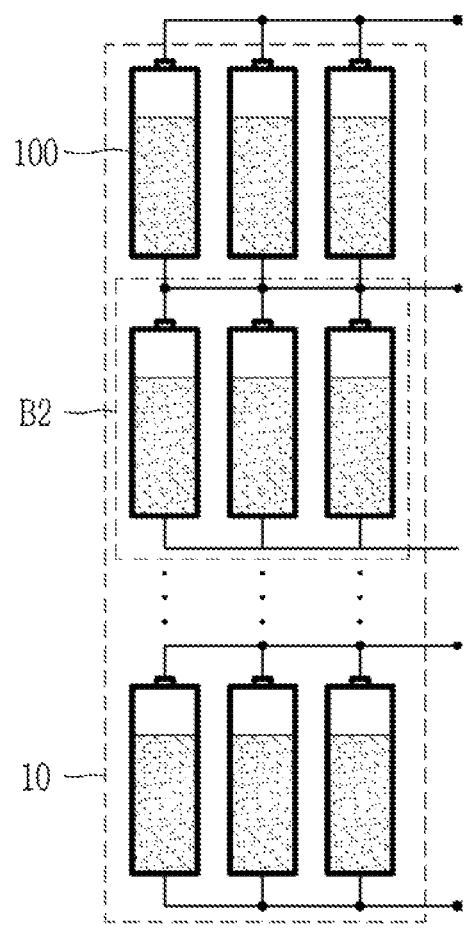
Figure 1C:
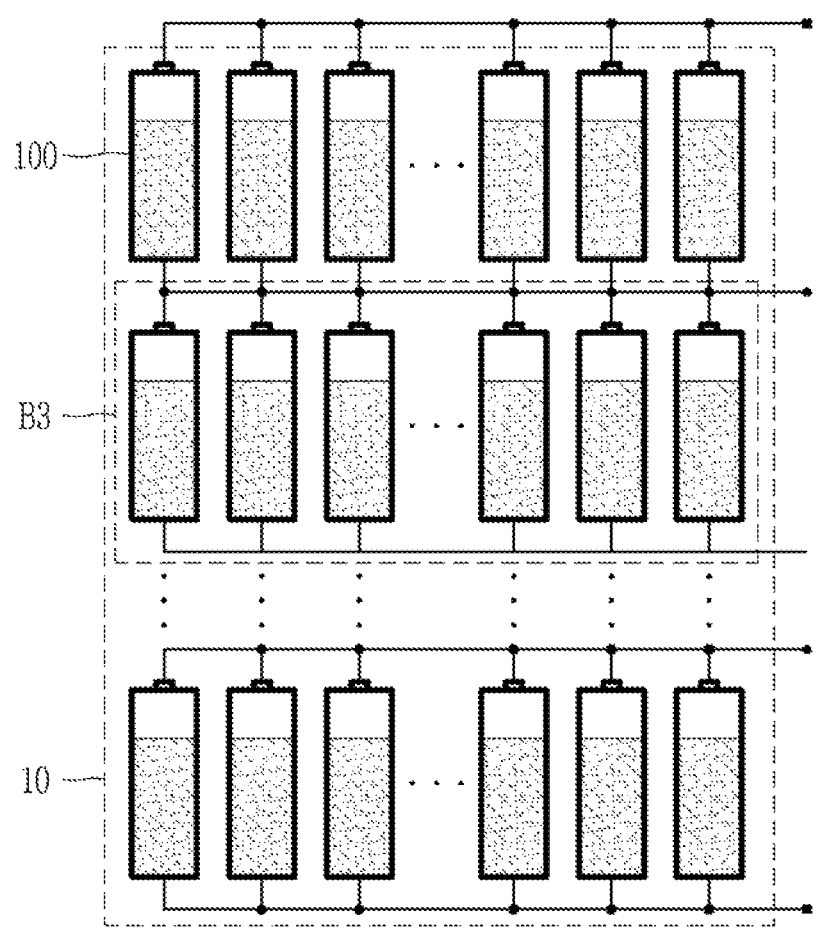

FIG. 1A to FIG. 1C illustrate example views showing cell banks in a battery module.

In the battery module 10, cell banks B1, B2, and B3 may be connected in series.

As illustrated in FIG. 1A, one bank B1 may include one battery cell 100, or as illustrated in FIG. 1B and FIG. 1C, one bank B2 or B3 may include a plurality of battery cells 100 connected in parallel. In general, when a plurality of battery cells are used in series and/or in parallel, a voltage may be measured and monitored based on the connected cells (or banks) connected in series.

It is ideal for the electrical characteristics such as voltage (SoC) and resistance of the battery cells to be uniform, but there may be a manufacturing dispersion, a difference in deterioration caused by using the battery, battery cell abnormality, etc., and thus there may be a difference in a voltage or a state of charge (SoC) between battery cells (or banks) connected in series. A state in which the voltage or state of charge (SoC) between the battery cells (or banks) connected in series is not uniform is referred to as a cell imbalance state.

When the cell imbalance exists, the usable capacity of the battery may decrease, and a possibility of overcharging of the cell may increase, which may result in accelerated deterioration. Therefore, cell balancing may be implemented to bring a cell imbalance state to have a uniform cell voltage or charging state (SoC), and may help provide stable operation of the battery. The cell balancing may be performed to equalize the voltage or charging state (SoC) of battery cells (or banks) connected in series when they are not equal, Thus, when a cell imbalance exists.

As a first method, passive balancing may be performed by consuming energy of a cell having a high voltage or state of charge (SoC). As a method that consumes energy, passive balancing my include, for example, discharging cells through a resistor.

As a second method, active balancing may be implemented to transfer energy of a cell with a high voltage or state of charge (SoC) to a cell with a low voltage or state of charge (SoC) to equalize the voltage or state of charge (SoC) between the two cells. The active balancing may provide advantages in terms of transferring energy to other cells (or banks) without consuming energy, but it may use many components, which may increase manufacturing cost and present challenges in control the active balancing. Accordingly, in general, the passive balancing may be mainly used.

Performing cell balancing using passive balancing includes determining which cell (or bank) energy needs to be consumed from, for example, determining which cell (or bank) should be discharged, which cell (or bank) should be equalized based on the voltage or state of charge (SoC), when to perform the cell balancing, etc. In addition, when there is a difference in capacity of cells (or banks), although cell balancing is performed, an imbalance may occur in a range of a certain voltage or a certain state of charge (SoC), so it should be determined which range of a voltage or state of charge (SoC) (equalization target range or point) should be equalized. This may be referred to as a cell balancing strategy.

When the cell balancing strategy is too simple, or when a cause of cell imbalance is not considered in the cell balancing strategy, invalid cell balancing may result. The invalid cell balancing indicates that cell balancing performed to equalize the voltage or state of charge (SoC) of cells (or banks) connected in series acts in an opposite direction as a result of equalization. For example, when a weak cell (or bank) exists in the battery module 10, invalid cell balancing may occur. This will now be described with reference to FIG. 2 to FIG. 4B.

Figure 2:
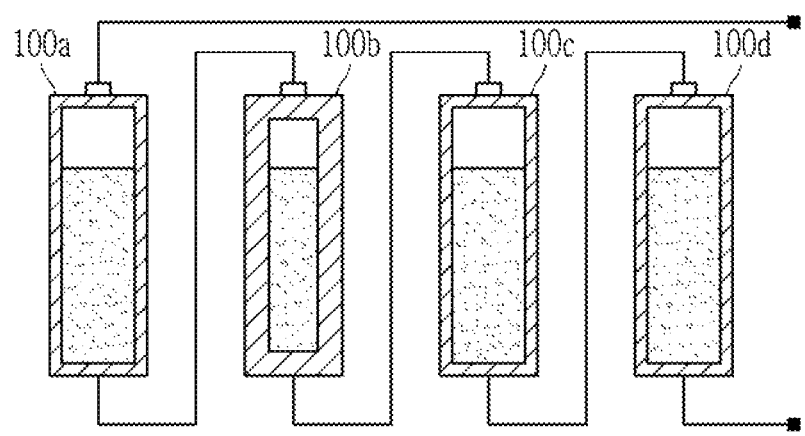
FIG. 2 illustrates an example view showing a weak cell in a battery module.
Figure 3A:
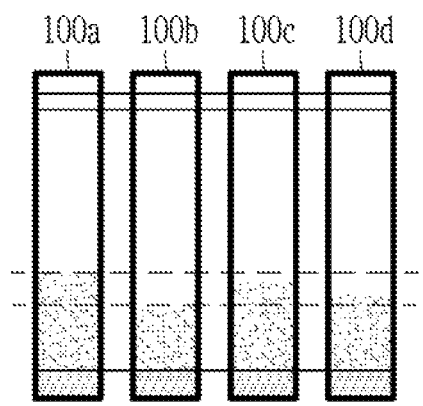
FIG. 3A to FIG. 3C illustrate an example view showing a state in which a battery module including a weak cell is balanced according to a general balancing method.
Figure 3B:
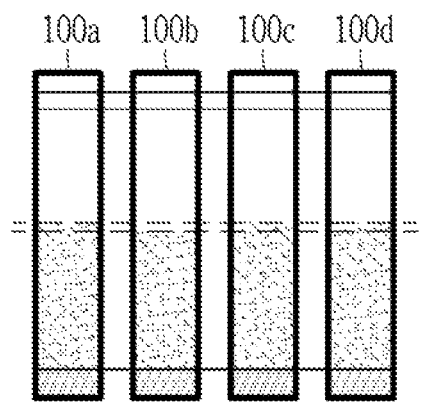
Figure 3C:
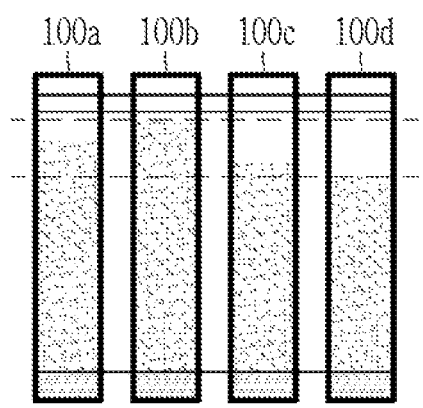
Figure 4A:
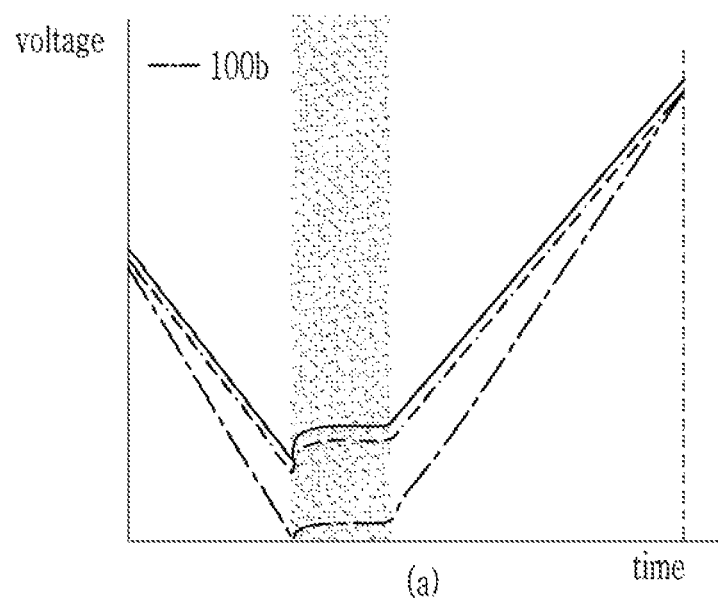
FIG. 4A and FIG. 4B illustrate graphs showing a cell imbalance state of a battery module including a weak cell.
Figure 4B:
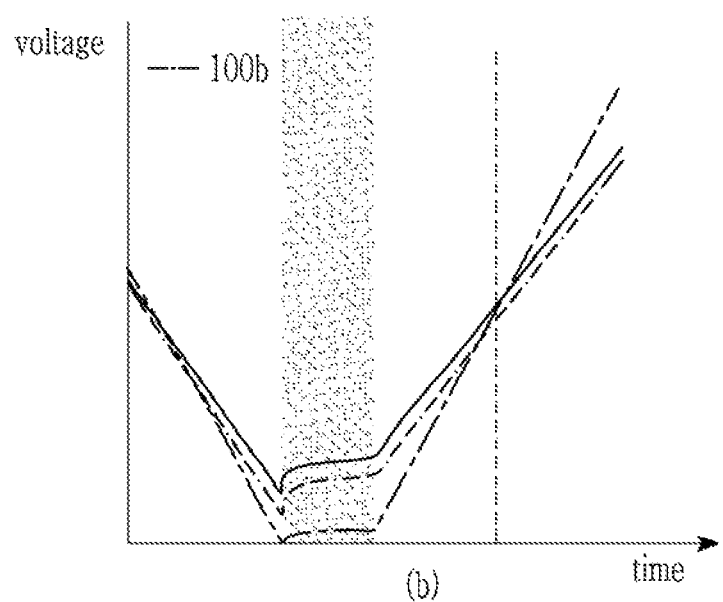

FIG. 2 illustrates an example view showing a weak cell in a battery module, FIG. 3A to FIG. 3C illustrate an example view showing a state in which a battery module including a weak cell is balanced according to a general balancing method, and FIG. 4A and FIG. 4B illustrate graphs showing a cell imbalance state of a battery module including a weak cell.

Referring to FIG. 2, a weak cell is a cell 100b (or bank) is shown as being significantly smaller in comparison with other cells (or banks) 100a, 100c, and 100d among cells (or banks) connected in series.

As illustrated FIG. 3A, a voltage of the weak cell 100b is a minimum voltage in a low voltage range. Thus, the cell balancing is performed on the other cells 100a, 100c, and 100d to equalize the voltage of the weak cell 100b to a target voltage.

As illustrated in FIG. 3B, the cell balancing is not performed in a middle voltage range because the cell voltage is equalized.

As illustrated in FIG. 3C, the voltage of the cell 100d is the minimum voltage in a high voltage range. Thus, the cell balancing must be performed on the cells 100a, 100c, and 100b.

As illustrated in FIG. 4A, when balancing in the high voltage range (top balancing) to perform equalization in a range having a high voltage is determined as a target, the cell balancing performed based on the voltage of the weak cell 100b in the low voltage range (as shown in FIG. 3A) may cause cell imbalance in the intermediate voltage range and the high voltage range. Accordingly, performing cell balancing in the low voltage range may result in cell imbalance (as opposed to an intended effect of equalizing in the high voltage range), resulting in invalid cell balancing.

As illustrated in FIG. 4B, the voltage of the weak cell 100b becomes the minimum voltage in the low voltage range, and when cell balancing is performed based on the minimum voltage, cell imbalance in the high voltage range is expanded due to a capacity difference between the weak cell 100b and other cells 100a, 100c, and 100d. A voltage for starting cell balancing may be increased in order to prevent such invalid cell balancing. In this case, since a voltage range in which cell balancing operates regardless of the presence or absence of a weak cell decreases, a time for performing cell balancing during charging decreases, thereby decreasing cell balancing efficiency.

As described in further detail below, in a battery system and a control method of the battery system according to example embodiments, an abnormal cell is diagnosed and cell balancing is performed based on a virtual reference cell voltage (or state of charge, SoC) in order to prevent invalid cell balancing, to increase cell balancing efficiency, and to provide a balanced (e.g., top-balanced) state in an equalization target voltage range.

Figure 5:
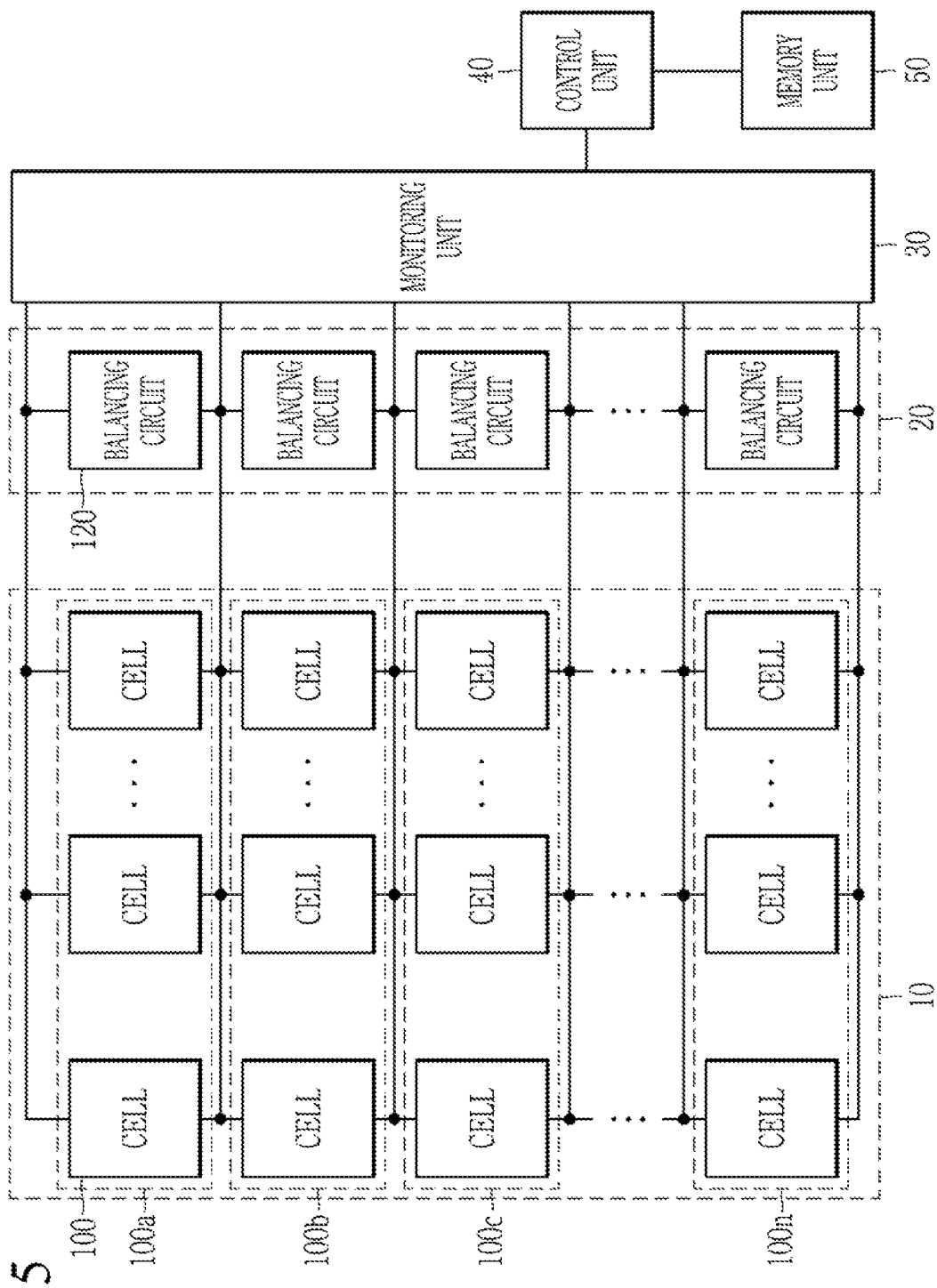
FIG. 5 illustrates a block diagram of a battery system according to an example embodiment.

FIG. 5 illustrates a block diagram of a battery system according to an example embodiment.

As illustrated, a battery system according to an example embodiment includes a battery module 10, a balancing unit 20, a monitoring unit 30, a control unit 40, and a memory unit 50.

The battery module 10 may include a plurality of unit battery cells 100 connected in series and/or in parallel. The battery module 10 may include a plurality of cell banks 110a, 110b, 110c, . . . , and 100n connected in series.

The balancing unit may include a plurality of balancing circuits 120 connected in parallel to the respective cell banks 100a, 100b, 100c, and 100n. Each of the balancing circuits 120 may include a balancing resistor (not illustrated) and a balancing switching element (not illustrated). The balancing circuit 120 may be operated by a signal transferred from the outside of the balancing unit 20 to lower a voltage of cells or banks that are connected in parallel.

The monitoring unit 30 may be connected to the cell banks 100a, 100b, 100c, and 100n to detect a voltage of each of the cell banks 100a, 100b, 100c, and 100n.

FIG. 5 illustrates an example in which each of the cell banks 100a, 100b, 100c, and 100n connected to the monitoring unit 30 includes a plurality of cells connected in parallel to each other, but the arrangement may be varied and, as described in FIG. 1, one cell bank may include only one cell.

The monitoring unit 30 may detect a current flowing in the cell banks 100a, 100b, 100c, . . . , and 100n, and a temperature of each of the cell banks 100a, 100b, 100c, . . . , and 100n.

The control unit 40 may receive information related to parameters such as a voltage, a current, and a temperature detected from the monitoring unit 30, and may calculate state information of the battery, such as a state of charge (SoC) of each bank, a state of health (SoH) of each bank, and a state of power (SoP) of each bank, based on the received information.

The control unit 40 may calculate current capacity of each of the cell banks 100a, 100b, 100c, . . . , and 100n using one or more of an open circuit voltage (OCV), SoH, and SoC. The control unit 40 may also predict the current capacity of each of the cell banks 100a, 100b, 100c, . . . , and 100n, by, for example, considering the temperature of each of the cell banks 100a, 100b, 100c, . . . , and 100n.

The control unit 40 may diagnose an abnormal cell using parameters such as the voltage, the current, and the temperature detected from the monitoring unit 30, as well as battery state information such as the SoC and the capacity. For example, the control unit 40 may determine an abnormal cell bank (or cell), and may also determine a type of imbalance of the abnormal cell bank (or cell).

The control unit 40 may set a cell balancing criteria and target depending on the presence or absence of an abnormal cell, the abnormality type of the abnormal cell, and the like. The control unit 40 may transfer a control signal to the balancing unit 20 such that cell balancing is performed depending on the set criteria and target.

The control unit 40 may be a battery management unit (BMU) and/or a battery management system (BMS), and the balancing unit 20 and the monitoring unit 30 may be cell supervision circuits (CSC).

The memory unit 50 may store the information related to parameters such as voltage, current, and temperature obtained from the monitoring unit 30, the state of charge (SoC) of each bank calculated by the control unit 40, battery state information such as the state of health (SoH) of each bank, the state of power (SoP) of each bank, and diagnosis information of each bank determined by the control unit 40.

The diagnosis information may include information determined by the control unit 40 based on at least one of the parameter information and the state information. For example, when a parameter such as a voltage value is obtained in an idle period, the control unit 40 may calculate and compare the charging state (SoC) of each bank based on the voltage value, and may store information related to a bank having a state of charge (SoC) that is lower than that of other banks in the memory unit 50. Subsequently, when charging is performed and a voltage value is obtained in the idle period again, the control unit 40 may calculate and compare the charging state (SoC) of each bank based on the voltage value again, and may determine whether a bank having a lower state of charge (SoC) after charging than the other banks matches the bank having the lower state of charge (SoC) before charging of the other banks, stored in the memory unit 50, to determine the corresponding bank as an SoC shift bank (cell).

A control method of the battery system will now be described with reference to FIG. 6.

Figure 6:
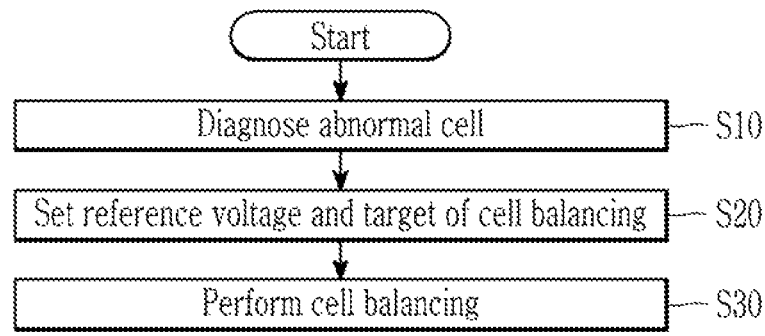
FIG. 6 is a flowchart illustrating a control method of a battery system according to an example embodiment.

FIG. 6 is a flowchart illustrating a control method of a battery system according to an example embodiment.

Referring to FIG. 6, the control unit 40 may diagnose an abnormal cell (or bank) (S10). Types of the abnormal cell include may SoC shift cells, weak cells, and high-impedance cells. The control unit 40 may determine an abnormal cell bank (or cell) and an abnormality type of the abnormal cell bank (or cell) using the parameters such as the voltage, the current, and the temperature detected from the monitoring unit 30, as well as the battery status information such as the SoC and the capacity.

The control unit 40 may detect an abnormal cell using a statistical method or machine learning on the SoC of each cell, the capacity, a voltage increase rate according to capacity increase, and battery resistance.

The control unit 40 will be now described with reference to FIG. 7 to FIG. 10C in connection with the diagnosing of the abnormal cell (or bank).

Figure 7:
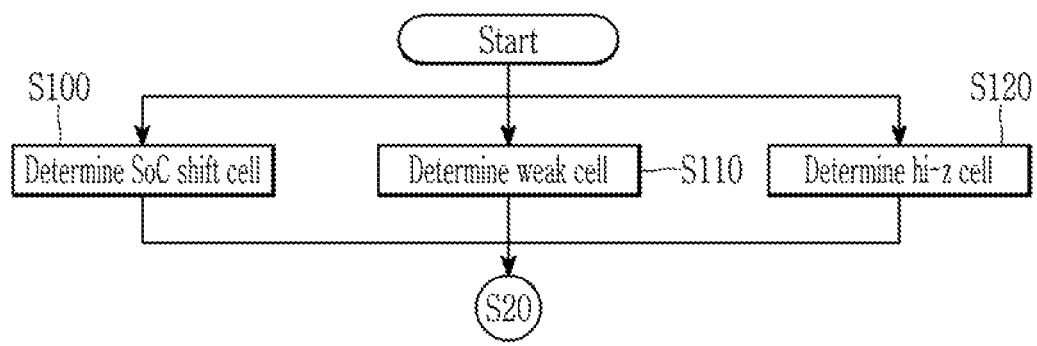
FIG. 7 illustrates a flowchart specifically showing an example of an abnormal cell diagnosis operation of FIG. 6.
Figure 8A:
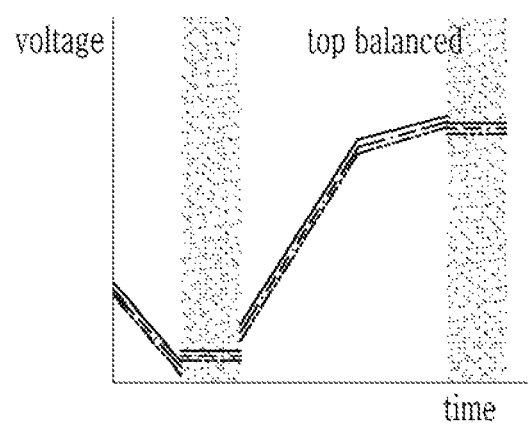
FIG. 8A to FIG. 8C illustrate graphs showing changes in a cell voltage of an SoC shift cell.
Figure 8B:
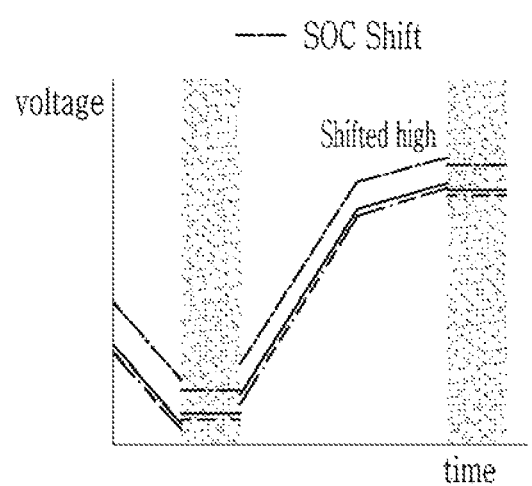
Figure 8C:
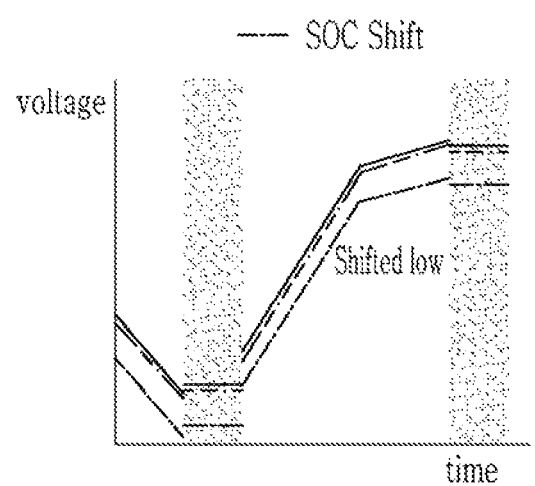
Figure 9A:
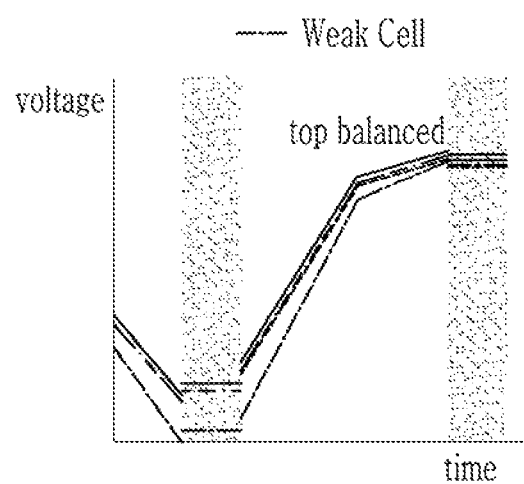
FIG. 9A to FIG. 9C illustrate graphs showing changes in a cell voltage of a weak cell.
Figure 9B:
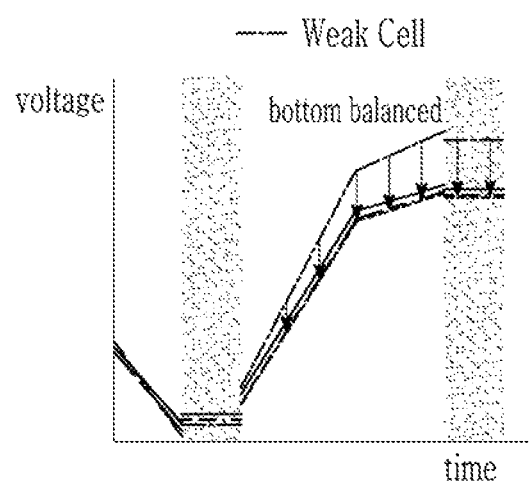
Figure 9C:
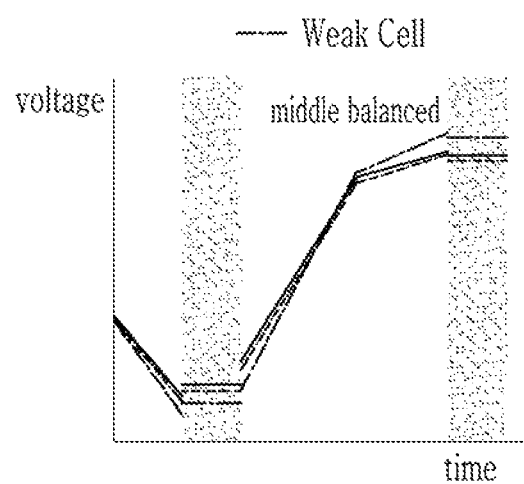
Figure 10A:
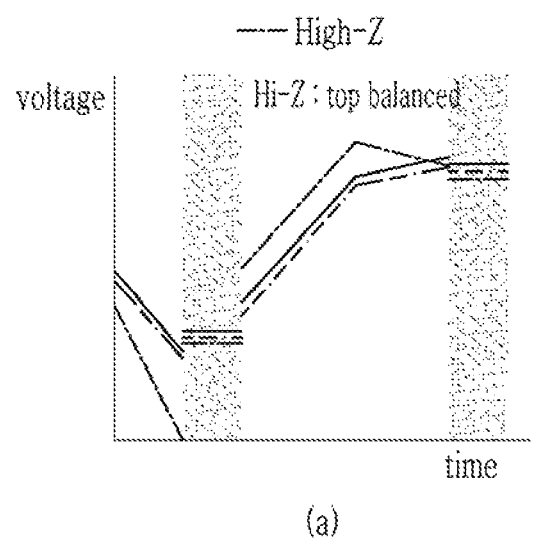
FIG. 10A to FIG. 10C illustrate graphs showing changes in a cell voltage of a high-impedance cell.
Figure 10B:
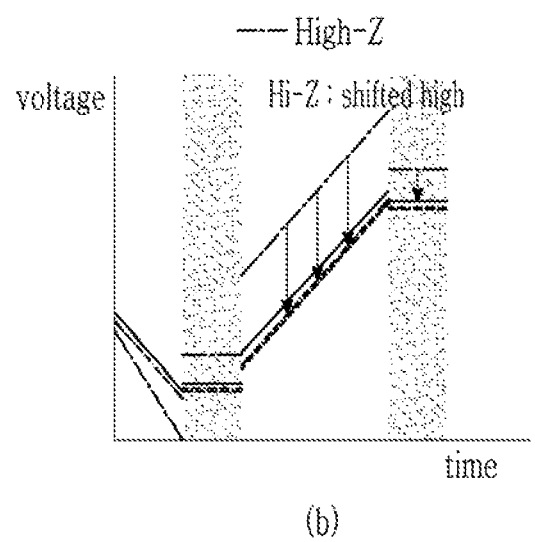
Figure 10C:
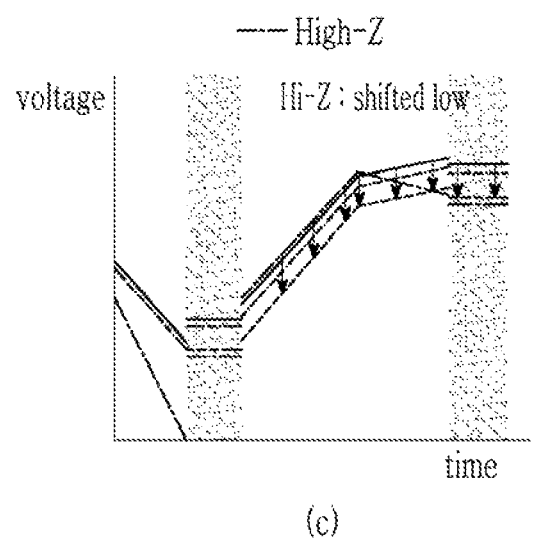

FIG. 7 illustrates a flowchart specifically showing an example of an abnormal cell diagnosis operation of FIG. 6, FIG. 8A to FIG. 8C illustrate graphs showing changes in a cell voltage of an SoC shift cell, FIG. 9A to FIG. 9C illustrate graphs showing changes in a cell voltage of a weak cell, and FIG. 10A to FIG. 10C illustrate graphs showing changes in a cell voltage of a high-impedance cell.

Referring to FIG. 7, the control unit 40 may determine an SoC shift cell (S100), determine a weak cell (S110), and determine a high-impedance cell (S120).

The SoC shift cell has a similar value to capacity of the cell (or bank) due to a difference in self discharge between cells (or banks), capacity distribution, capacity variation, and cell anomaly, but may be a cell (or bank) with a higher or lower SoC than other cells (or banks).

In further detail, referring to FIG. 8A to FIG. 8C, FIG. 8A illustrates a graph of voltage values when the battery module 10 is balanced in a high voltage range. In both the high voltage range and a low voltage range, voltage values of cells (or banks) included in the battery module 10 have similar values.

FIG. 8B and FIG. 8C illustrate graphs of voltage values when there are cells with SoC shifts, respectively. When an SoC shift is present, a balancing operation may be performed based on a minimum voltage cell, as in general cell balancing, and a range of voltages at which cell balancing is operated may be widely set from a low voltage to a high voltage.

Next, the weak cell may be a cell (or bank) having lower capacity than other cells (or banks) due to differences in aging between cells (or banks), cell anomalies, or the like.

Referring to FIG. 9A to FIG. 9C, FIG. 9A illustrates a balancing state in which a battery module including a weak cell is equalized in the high voltage range.

In FIG. 9A, a cell imbalance state appears in the low voltage range and the middle voltage range, and when the equalization in the high voltage range is a balancing target, additional cell balancing may not be performed because it is equalized in the high voltage range so as to achieve the balancing target.

FIG. 9B and FIG. 9C respectively illustrate a bottom balanced state in the low voltage range and a middle balanced state in the balancing condition. When the equalization in the high voltage range is a balancing target, additional cell balancing is performed to reach a state as illustrated in FIG. 9A.

Next, a high-impedance cell is a cell having higher impedance or higher equivalent resistance than other cells (or banks) due to, for example, connection problems between cells (or banks), deterioration differences, and cell anomalies.

FIG. 10A illustrates a balancing state in the high voltage range in which a battery module including a high-impedance cell is equalized in the high voltage range.

In FIG. 10A, a cell imbalance state appears in the low voltage range and the middle voltage range, and when the equalization in the high voltage range is a balancing target, additional cell balancing may not be performed because it is equalized in the high voltage range so as to achieve the balancing target.

FIG. 10B and FIG. 10C respectively illustrate a case where an SoC of the high-impedance cell is upwardly shifted and a case where an SoC of the high-impedance cell is downwardly shifted.

When the equalization in the high voltage range is a balancing target, additional cell balancing is performed to reach a state as illustrated in FIG. 10A.

Next, the control unit 40 sets a reference voltage of the cell balancing and a target of the cell balancing (S20). The control unit 40 may set the reference voltage of the cell balancing and the target of the cell balancing in consideration of the presence or absence of the abnormal cell and an abnormality type of the abnormal cell. For example, when a weak cell and a high-impedance cell are present in the battery module 10, although the weak cell and the high-impedance cell have a minimum voltage, the control unit 40 may not set the weak cell and the high-impedance cell as reference cells for cell balancing. In this case, the control unit 40 may set a virtual reference cell, and perform cell balancing by comparing voltages between other cells and the virtual reference cell.

Next, the control unit 40 performs cell balancing (S30). The control unit 40 may generate a control signal and supply it to the balancing unit 20 such that a voltage of a cell targeted for cell balancing is lowered by the balancing circuit 120.

A control method of the battery system will be now described in detail.

First, a method for the control unit 40 to determine an SoC shift cell will be described with reference to FIG. 11 to FIG. 13.

Figure 11:
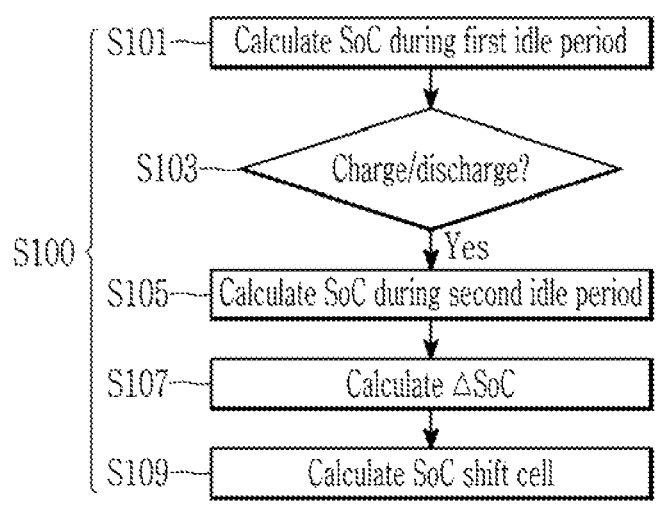
FIG. 11 illustrates a flowchart specifically showing an example of an SoC shift cell determining operation of FIG. 7.
Figure 12:
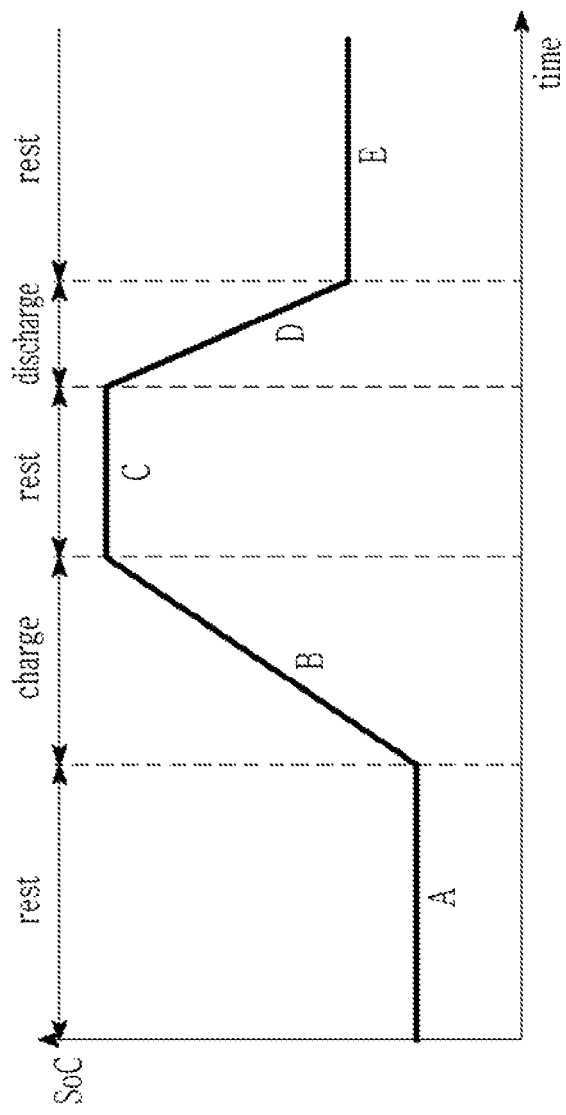
FIG. 12 illustrates a graph showing a voltage change for each period of a battery cell.
Figure 13:
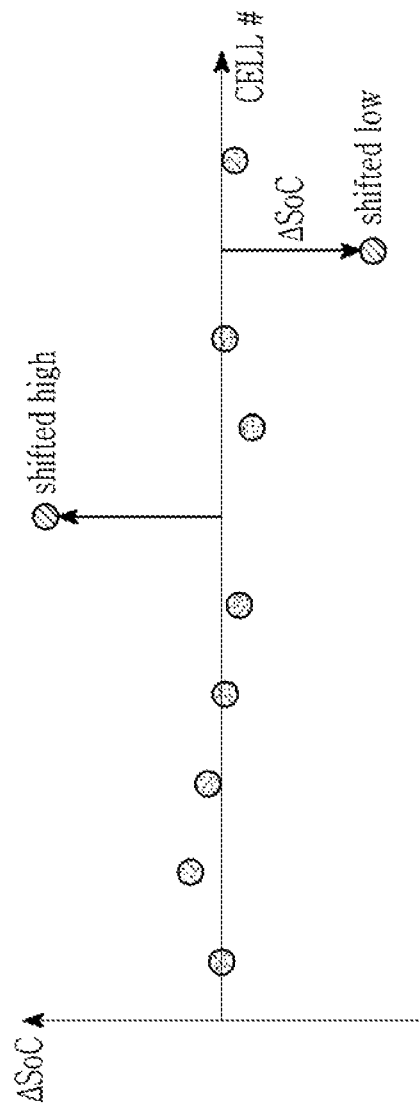
FIG. 13 illustrates a graph showing an SoC of an SoC shift cell.

FIG. 11 illustrates a flowchart specifically showing an example of an SoC shift cell determining operation of FIG. 7, FIG. 12 illustrates a graph showing a voltage change for each period of a battery cell, and FIG. 13 illustrates a graph showing an SoC of an SoC shift cell.

Referring to FIG. 11, the control unit 40 calculates an SoC of each cell based on a voltage value obtained during a first rest period (S101). For example, the control unit 40 may calculate the SoC of each cell during a period A of FIG. 12.

Next, the control unit 40 determines whether charging or discharging is performed (S103).

When it is determined that charging or discharging is performed, the control unit 40 calculates the SoC of each cell based on a voltage value obtained during a second rest period (S105). For example, the control unit 40 may calculate the SoC of each cell during a period C of FIG. 12.

Alternatively, when the SOC of each cell can be predicted in real time, the control unit 40 may acquire two SoC values separated by charging or discharging of a predetermined amount or more for each cell (or bank) without performing the operations S101, S103, and S105. For example, the control unit 40 may use the SoC of each cell (or bank) predicted by the BMU or BMS.

Next, the control unit 40 calculates an SoC deviation of each cell using the SoC calculated in operation S101 and the SoC calculated in operation S105 (S107). For example, referring to FIG. 13, an SoC distribution of each of the banks is illustrated.

The control unit 40 determines a bank (or cell) having an exceptional or outlier SoC as an SoC shift cell (S109). For example, the control unit 40 may determine a bank (or cell) having an SoC that is higher than that of other cells by a predetermined value as an SoC shift cell in which the SoC is upwardly shifted, and may determine a bank (or cell) having an SoC that is lower than that of other cells by a predetermined value as an SoC shift cell in which the SoC is upwardly or downwardly shifted. Thus, a cell with a significantly higher SOC than the average cell may be said to be shifted high, and a cell with a significantly lower SOC may be said to be shifted low.

When the SoC of a cell is higher by a predetermined value than an average or median value of the SoC of all cells using the SoC of each cell measured at any two time points, the control unit 40 may determine the cell as a cell in which an SoC shift has occurred. For example, when the SoC of one cell is higher or lower than the SoC of another cell by a predetermined value in two SoC data (SoC calculated in operation S101 and SoC calculated in operation S105) separated by charging or discharging of a predetermined amount or more, the control unit 40 may determine the cell as a cell where the SoC shift has occurred.

In addition, when the SoC of each cell cannot be calculated, the control unit 40 may determine the SoC shift cell using the OCV acquired during the idle period. For example, the control unit 40 may determine a bank (or cell) in which ΔOCV is abnormal as an SoC shift cell by substituting the SoC for the OCV in the above operations (S101 to S109).

In addition, the control unit 40 may calculate capacity of each cell and may determine the weak cell using the calculated capacity. The control unit 40 may calculate a current capacity of each of the cell banks using at least the OCV, the SoH, the SoC, etc., and may determine a cell that has smaller capacity than that of other cells by a predetermined value.

Alternatively, the control unit 40 may determine the weak cell using charge and discharge characteristics without using the capacity. Since the weak cell has a small capacity, a voltage change rate for the capacity increase or decrease is greater than that of the average cell (or bank). For example, in the case of charging, the weak cell has a larger voltage increasing amount for the same charging capacity. Thus, the control unit 40 may determine a weak cell using a dV/dQ characteristic.

For example, in the case of the weak cell, a voltage change amount (ΔV) is generally greater than that of other cells, and the control unit 40 may determine the weak cell by calculating the change amount (ΔV) of each cell voltage for a capacity change amount (ΔQ).

As another example, in the case of the weak cell, since the capacity change amount (ΔQ) is smaller than that of other cells during a fixed voltage period, the capacity change amount (ΔQ) for each cell may be calculated to determine the weak cell during the fixed voltage period [VA, VB] (ΔV).

Then, the control unit 40 may calculate an internal resistance value of each cell, and may determine a high-impedance cell and an internal short-circuit cell using the calculated internal resistance value.

The control unit 40 may measure a voltage, a current, and a time change of each cell during each of a rest period and a charge/discharge period, and may diagnose the abnormal cell by calculating the capacity change, etc. In addition, parameters measured by the monitoring unit 30 and information calculated by the control unit 40 may be recognized or classified by outlier detection or machine learning algorithms, and thus the control unit 40 may detect an abnormal cell having a significantly different parameter from that of other cells.

Next, a method of setting a reference voltage and a cell balancing target for performing cell balancing will be described with reference to FIG. 14 to FIG. 15B.

Figure 14:
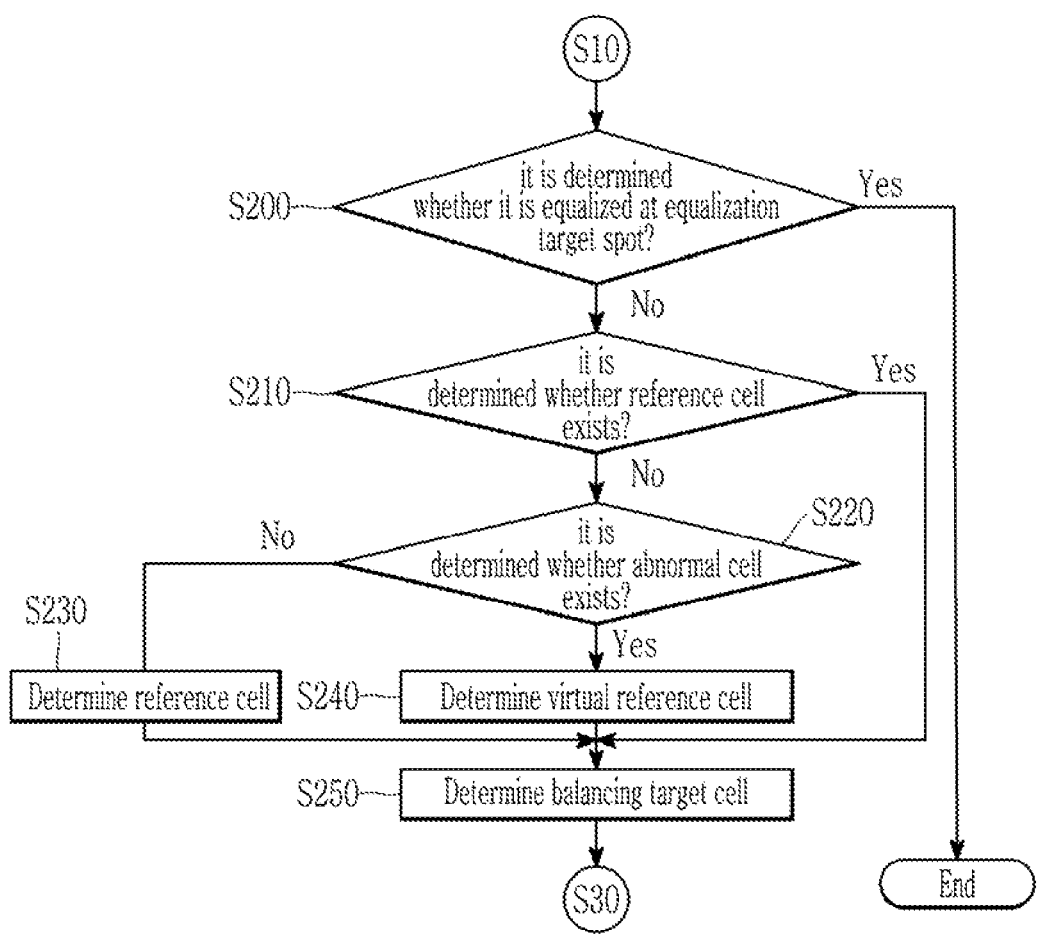
FIG. 14 illustrates a flowchart specifically showing an example of a cell balancing criterion and target setting operation of FIG. 6.
Figure 15A:
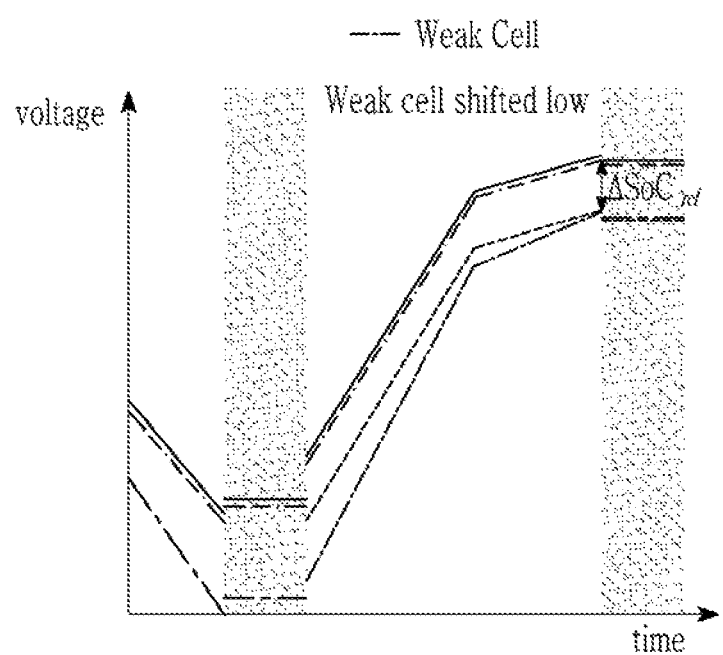
FIG. 15A and FIG. 15B illustrate a graph showing a case where a minimum voltage cell is an abnormal cell at a charging ending time point.
Figure 15B:
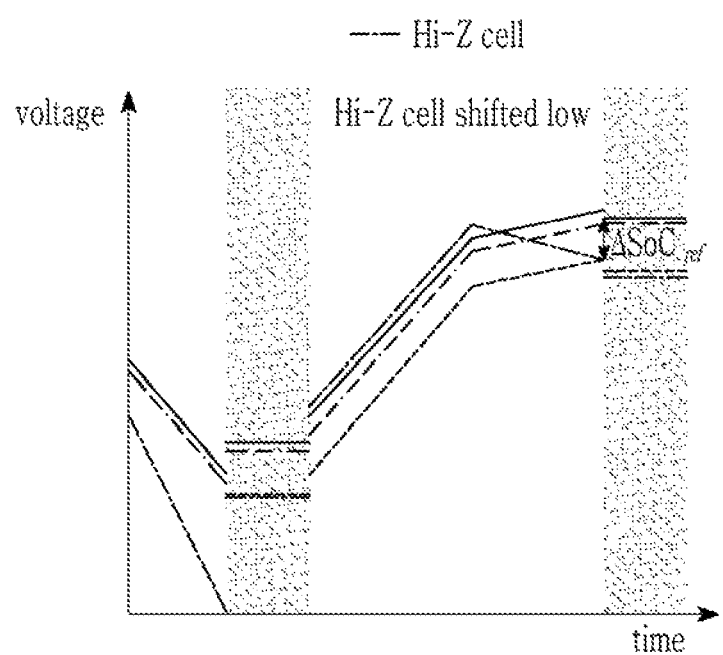

FIG. 14 illustrates a flowchart specifically showing an example of a cell balancing criterion and target setting operation of FIG. 6, and FIG. 15A and FIG. 15B illustrate graphs showing a case where a minimum voltage cell is an abnormal cell at a charging ending time point.

When diagnosis of an abnormal cell is completed, the control unit 40 determines whether the battery module 10 is equalized at an equalization target range (S200). Herein, the control unit 40 will be described as determining whether to balance in the high voltage range, but the control unit 40 may determine whether to perform balancing in the low or middle voltage range according to an application or purpose of use, etc.

When it is determined that the battery module 10 is in an equalized state in the high voltage range, no cell balancing is performed, and thus the control unit 40 ends cell balancing.

The control unit 40 determines whether an abnormal cell exists in the battery module 10 (S210).

When it is determined that the abnormal cell exists in the battery module 10, the control unit 40 determines whether there is a reference cell (S220). The reference cell is a cell that is used a basis for cell balancing, and balancing may be performed such that the voltage or SoC of the other cell(s) is the same as/similar to the voltage or SoC of the reference cell.

The control unit 40 determines the minimum voltage cell as the reference cell when it is determined that there is no abnormal cell in the battery module 10 and when there is an abnormal cell in the battery module 10, but the cell having the minimum voltage at the equalization target range (e.g., charging cut-off time point) is not the abnormal cell (Thus, a weak cell, a high-impedance cell, or an internal short-circuit cell) (S230).

When it is determined that there is no reference cell, the control unit 40 determines the virtual cell as the reference cell (S240). When the equalization in the high voltage range is targeted, the virtual cell may be calculated as follows.

First, the control unit 40 sets a reserved cell index 'r' for the reference cell at a charging cut-off time point. The control unit 40 uses abnormality type information of the abnormal cell acquired in operation S10 when setting the cell index.

For example, when there are only SoC shift cells in the battery module 10, the control unit 40 sets an index of the cell having the minimum voltage as the reserved cell index 'r' at the charging cut-off time point. In this case, $$\Delta SOC_{ref} = (SOC_r - SOC_{CBGoal})|_{at\ CB\ Target\ Spot}$$
$$= (SOC_r - SOC_{min\ cell})|_{at\ charge\ cut-off} = 0,$$

wherein $SOC_r$ indicates the SoC of the reserved cell (e.g., minimum voltage cell), $SOC_{CBGoal}$ indicates the SoC of the equalization target cell (minimum voltage cell in this example), and $SOC_{min\ cell}$ indicates the SoC of the minimum voltage cell.

Thus, when only the SoC shift cell exists in the battery module 10, the control unit 40 performs cell balancing based on the voltage of the cell having the minimum voltage at the charging cut-off time point.

As another example, a method of determining a virtual reference cell when at least one of a weak cell, a high-impedance cell, and an internal short-circuit cell is present in the battery module 10 will now be described.

The control unit 40 may set an index of a cell that is a minimum voltage among cells (excluding a weak cell, a high-impedance cell, and an internal short circuit cell) as a reserved cell index.

The virtual reference cell voltage ($V_{ref}$) may be calculated using following Equations 1 to 3 in order to achieve an equalization state in the high voltage range.

$$\Delta SOC_{ref} = (\Delta SOC_r - \Delta SOC_{CBGoal})|_{at\ CB\ Target\ Spot} = (\Delta SOC_r - \Delta SOC_{min\ cell})|_{at\ charge\ cut-off} \quad \text{(Equation 1)}$$

$$\Delta V_{ref} = f(\Delta SOC_{ref}) \quad \text{(Equation 2)}$$

$$V_{ref} = V_r - \Delta V_{ref} \quad \text{(Equation 3)}$$

Thus, although at least one of a weak cell, a high-impedance cell, and an internal short-circuit cell is present in the battery module 10, when a cell having a minimum voltage at the equalization target range (e.g., charging cut-off time point) does not correspond to at least one of the weak cell, the high-impedance cell, and the internal short circuit cell, the cell having the minimum voltage becomes the reference cell as described above.

In this case, a virtual reference cell voltage ($V_{ref}$) may be set as a cell voltage of an $r^{th}$ cell (i.e., the cell having the minimum voltage at the equalization target range) as shown in Equations 4 to 6 below.

$$\Delta SOC_{ref} = (SOC_r - SOC_{CBGoal})|_{at\ CB\ Target\ Spot} \quad \text{(Equation 4)}$$
$$= (SOC_r - SOC_{min\ cell})|_{at\ charge\ cut-off} = 0$$

$$\Delta V_{ref} = f(\Delta SOC_{ref}) = 0 \quad \text{(Equation 5)}$$

$$V_{ref} = V_r - \Delta V_{ref} = V_r \quad \text{(Equation 6)}$$

However, in the case where the cell having the minimum voltage at the equalization target range (e.g., charging cut-off time point) corresponds to at least one of the weak cell, the high-impedance cell, and the internal short circuit cell, when the cell with the minimum voltage is determined as the reference cell, invalid cell balancing may occur, and thus a reserved cell index r may be set as an index of a cell having a minimum voltage among the cells excluding it.

In this case, $\Delta SOC_{ref} = (\Delta SOC_r - \Delta SOC_{CBGoal})|_{at\ CB\ Target\ Spot} = (\Delta SOC_r - \Delta SOC_{min\ cell})|_{at\ charge\ cut-off}$ indicates an SoC difference between the reserved cell and the cell with the minimum voltage at the equalization target range (e.g., charging cut-off time point).

An SoC of the virtual reference cell for cell balancing indicates the SoC of the reserved cell index 'r' that is downwardly shifted by $\Delta SOC_{ref}$, and a voltage ($V_{ref}$) of the virtual reference cell indicates the voltage of the reserved cell r that is downwardly shifted by a voltage ($\Delta V_{ref}$) corresponding to $\Delta SOC_{ref}$.

The voltage of the virtual reference cell is illustrated by dotted lines in FIG. 15A and FIG. 15B.

In Equation 1 above, $\Delta SOC_{ref} = SoC_r - SoC_{min\ cell}$ at charge cut off indicates the SoC difference between the reserved cell and the cell having the minimum voltage cell at the charging cut-off time point.

Next, the control unit 40 determines a cell balancing target cell (S250). The cell balancing target cell indicates a cell that needs cell balancing. The control unit 40 may determine a cell that is not equalized based on the reference cell voltage as a cell balancing target at the equalization target range (e.g., charging cut-off time point). For example, when a certain cell has a voltage that is higher than the reference cell voltage by a predetermined voltage or higher at the equalization target range (e.g., charging cut-off time point), the control unit 40 may determine the cell as a cell that is not balanced, and may determine it as a balancing target cell.

Next, a cell balancing operation will be described in detail with reference to FIG. 16 to FIG. 18.

Figure 16:
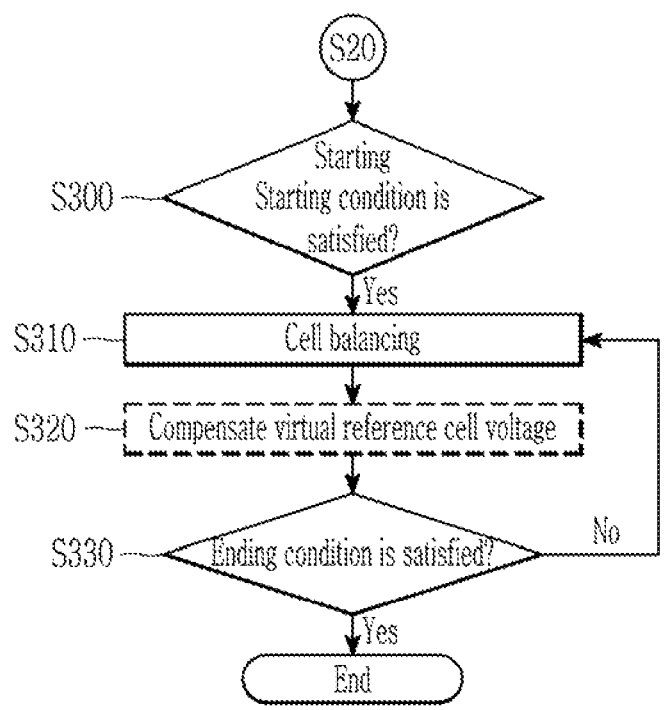
FIG. 16 illustrates a flowchart specifically showing an example of a cell balancing operation of FIG. 6.
Figure 17:
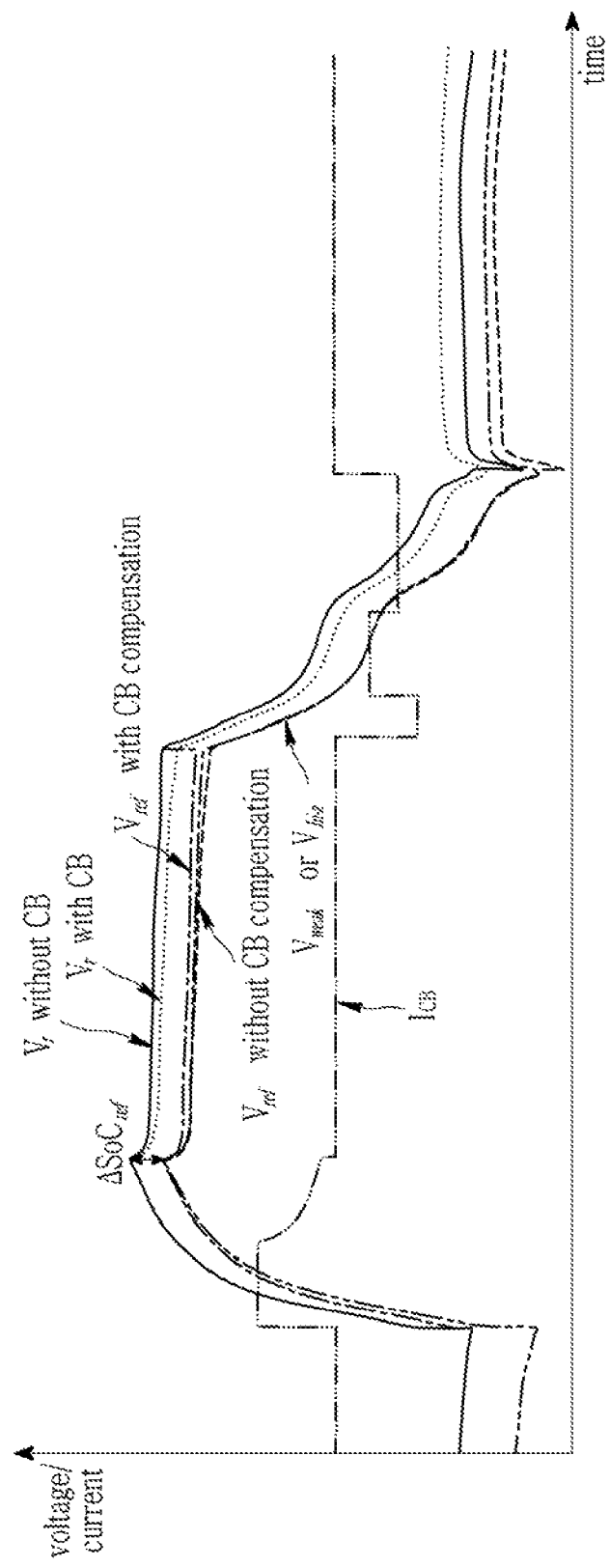
FIG. 17 illustrates a graph showing a case in which voltage of a virtual reference cell is compensated when cell balancing is performed.
Figure 18:
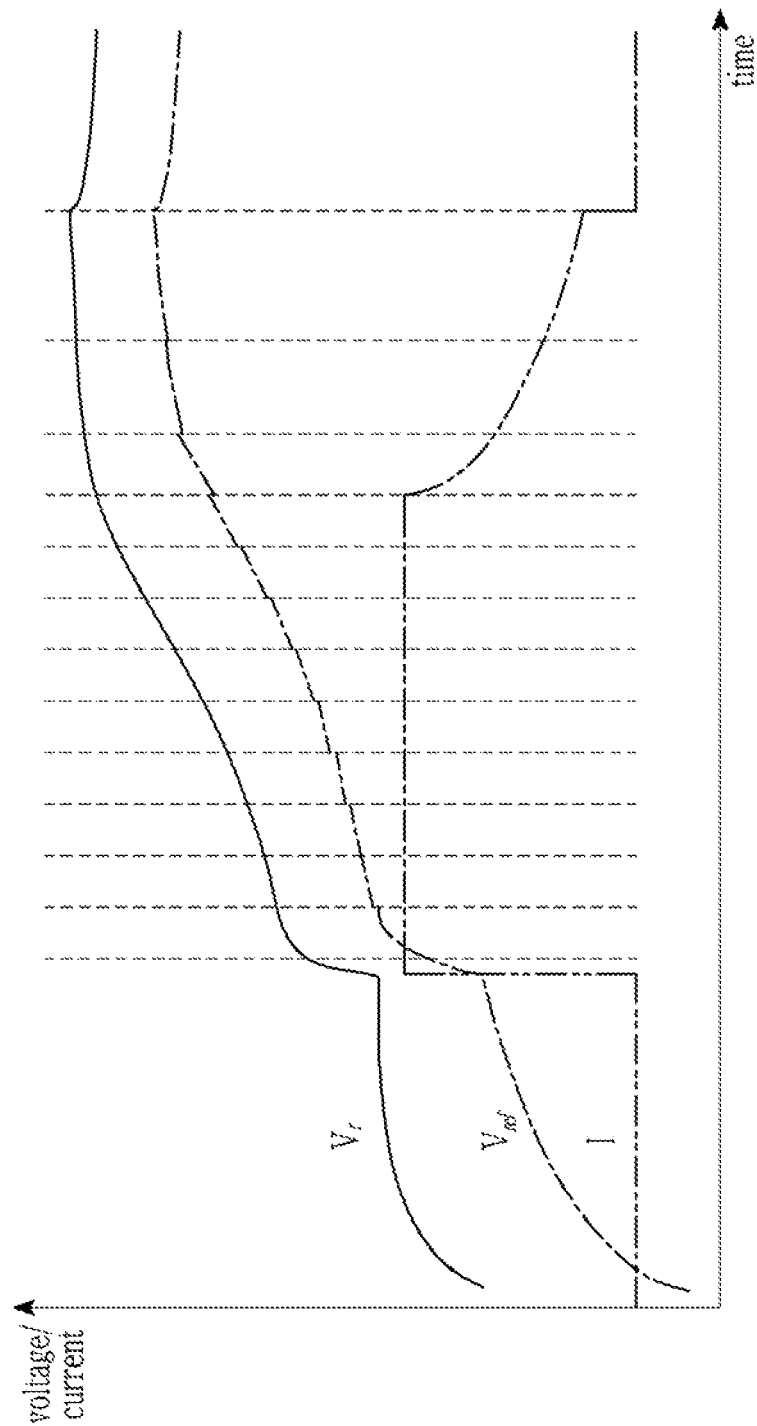
FIG. 18 illustrates a graph showing an example of a reference cell voltage calculated when cell balancing is performed.

FIG. 16 illustrates a flowchart specifically showing an example of a cell balancing operation of FIG. 6, FIG. 17 illustrates a graph showing a case in which voltage of a virtual reference cell is compensated when cell balancing is performed, and FIG. 18 illustrates a graph showing an example of a reference cell voltage calculated when cell balancing is performed.

Referring to FIG. 16, the control unit 40 determines whether a condition capable of starting cell balancing is satisfied (S300). The cell balancing may be started when a voltage (or SoC, current, or temperature condition) capable of starting the cell balancing is satisfied, it is not in the balancing state at the equalization target range, and it is not in a failure state.

Then, the control unit 40 may generate a control signal for starting the cell balancing. The balancing unit 20 performs the cell balancing by the control signal (S310). The cell balancing may be performed during charging or an idle period.

The control unit 40 compensates the virtual reference cell voltage in consideration of a situation that the voltage of the reserved cell used in obtaining the virtual reference cell voltage decreases due to cell balancing when the situation occurs (S320).

The reserved cell may also be a cell balancing target using the voltage (or SoC) difference ($V_r - V_{ref}$) of the virtual reference cell.

For example, when the cell balancing is performed on the reserved cell, the voltage $V_r$ is reduced as much as the balancing is performed ($\Delta SOC_{r|by\ cell\ balancing}$) in a formula ($V_{ref} = V_r - \Delta V_{ref} = V_r - f(\Delta SOC_{ref})$) for obtaining the virtual reference cell voltage, it is necessary to compensate it. Accordingly, the SoC change amount of the reserved cell caused by the cell balancing is subtracted from $\Delta SOC_{ref}$ corresponding to the SOC difference between the reserved cell and the cell with the minimum voltage.

When the cell balancing is performed on the reserved cell, compensation for $\Delta SOC_{ref}$ may be expressed by following Equations 7 to 9.

$$\Delta SOC_{ref} = (SOC_r - SOC_{CBGoal})|_{at\ CB\ Target\ Spot} - \Delta SOC_r|_{by\ cell\ balancing} \quad \text{(Equation 7)}$$

$$\Delta SOC_r|_{by\ cell\ balancing} = \frac{I_{CB} \cdot \Delta T_{CB\ On} \cdot duty_{CB}}{K \cdot Maxcap_r} \quad \text{(Equation 8)}$$

$$V_{ref} = V_r - \Delta V_{ref} = V_r - f(\Delta SOC_{ref}) \quad \text{(Equation 9)}$$

Herein, $I_{CB}$ indicates a balancing current, $\Delta T_{CB\ On}$ indicates a time when the cell balancing is performed, $duty_{CB}$ indicates a cell balancing duty ratio, and $Maxcap_r$ indicates capacity of the reserved cell 'r'.

In an example embodiment, $\Delta SOC_r$ and $\Delta SOC_{ref}$ may be updated at a regular interval (e.g., every 1 minute) by Equation 2.

As illustrated in FIG. 17, when the reserved cell is targeted for cell balancing, an uncompensated voltage of the virtual reference cell may be lower than the voltage of the cell having the minimum voltage at the equalization target range (charging cut-off time point in FIG. 17), and thus an excessive cell balancing error may occur. Accordingly, when the reserved cell is targeted for the cell balancing, the voltage of the virtual reference cell is compensated.

A voltage ($\Delta V_{ref}$) corresponding to $\Delta SOC_{ref} = (SOC_r - SOC_{CBGoal})|_{at\ CB\ Target\ Spot} - \Delta SOC_r|_{by\ cell\ balancing}$ is subtracted from $V_r$ in order to obtain the virtual reference cell voltage ($V_{ref}$).

$(SOC_r - SOC_{CBGoal})|_{at\ CB\ Target\ Spot}$, which indicates an SoC difference between the virtual reference cell and the reserved cell at the equalization target range, may be approximated as follows.

For example, when the equalization is targeted at the charge cut-off time point, the virtual reference cell voltage during the idle period may be approximated as in Equations 10 and 11.

$$(SOC_r - SOC_{CBGoal})|_{at\ CB\ Target\ Spot} = (SOC_r - SOC_{min\ cell})|_{at\ charge\ cut-off} \approx SOC(V_r) - SOC(V_{min\ cell}) = \Delta SOC_{at\ CB\ Goal\ Position} \quad \text{(Equation 10)}$$

$$\Delta V_{ref} \approx OCV(\Delta SOC(V_r) - \Delta SOC_{at\ CB\ Goal\ Position}) \quad \text{(Equation 11)}$$

The voltage of the virtual reference cell may be approximated as a value that is obtained by subtracting a difference between the virtual reference cell and the reserved cell obtained or approximated in the equalization target range from a value that is obtained by converting the voltage of the reserved cell to the SoC during the idle period, i.e., a value obtained by obtaining the SoC of the virtual reference cell and converting it back to OCV.

When the reserved cell is targeted for the cell balancing during the idle period, $\Delta SOC_{r|cell\ balancing}$ for compensating the virtual reference cell voltage may be periodically calculated and reflected for compensation as described above. Thus, the virtual reference cell voltage during the idle period may be approximated as $\Delta V_{ref} \approx OCV(\Delta SOC(V_r) - \Delta SOC_{at\ CB\ Goal\ Position} - \Delta SOC_r|_{by\ cell\ balancing})$.

$\Delta SOC_{ref}$ is converted into a voltage in $$V_{ref} = V_r - \Delta V_{ref} = V_r - f(\Delta SOC_{ref}) \text{ and}$$

$$\Delta SOC_{ref} = (\Delta SOC_r - \Delta SOC_{CBGoal})|_{at\ CB\ Target\ Spot} - \Delta SOC_r|_{by\ cell\ balancing}$$

during all periods, but it is not approximated by using a SoC-OCV relationship (unlike in the idle period), and thus ΔV for a 1% ΔSOC increase may be obtained from a voltage increase when the SoC of the reserved cell increases by a predetermined rate during charging, and it may then be multiplied by $\Delta SOC_{ref}$ to approximate $\Delta V_{ref}$.

Thus, the voltage of the virtual reference cell is approximated using a value approximated by $\Delta V_{ref}$=f ($\Delta SOC_{ref} \approx \Delta SOC_{ref}$:ΔV per 1% SOC increase. As the voltage corresponding to the predetermined rate increment of the previous SoC is calculated and used for calculating the current voltage ($V_{ref}$) of the virtual reference cell, the voltage ($V_{ref}$) of the virtual reference cell during the charging period may be discontinuous as illustrated in FIG. 18.

Next, the control unit 40 determines whether a condition for ending the cell balancing is satisfied (S330). The control unit 40 may end the cell balancing when the voltage (or SoC, current, or temperature condition) capable of ending the cell balancing is satisfied, satisfies a balancing state in the high voltage range, or is in a failure state.

According to an example embodiment, it is possible to prevent invalid cell balancing may be prevented, and a battery system that is balanced (e.g., top-balanced) at the equalization target range may be provided, thereby maximizing the battery capacity transferred to the load.

An electronic or electrical device and/or any other related device or component according to an example embodiment may be implemented using suitable hardware, firmware (e.g., an application-specific integrated circuit (ASIC)), software, or a combination of software, firmware, and hardware. For example, various components of these devices may be disposed on one integrated circuit (IC) chip or on separate IC chips. In addition, various components of these devices may be implemented on a flexible printed circuit film (TCP), a tape carrier package (TCP), a printed circuit board (PCB), or on one substrate. The electrical connections or interconnections described herein are implemented by wires or conductive elements, e.g., on a PCB or on other types of circuit carriers. The conductive elements may include metallization, e.g., surface metallization, pins, and/or conductive polymers, or ceramics. In addition, electrical energy may be transmitted over a wireless connection, e.g., using electromagnetic radiation and/or light.

In addition, various components of these devices may be executed on one or more processors to perform various functions described herein and within one or more computing devices, and may be processes or threads that execute computer program instructions and may interact with other system components. Computer program instructions may be stored in a memory that can be implemented in a computing device using a standard memory device, such as, e.g., a random access memory (RAM). The computer program instructions may also be stored on other non-transitory computer readable media, e.g., CD-ROMs, flash drives, and the like.

By way of summation and review, statically managing output and discharge of battery power may not be sufficient to satisfy dynamic power demands of various electricity consumers connected to a battery system. Accordingly, information is steadily or intermittently exchanged between the battery system and the controllers of electricity consumers. This information may include an actual state of charge (SoC) of the battery system, potential electrical performance, charging capability, internal resistance, and actual or predicted power demand or consumer surplus.

For monitoring, controlling, and/or setting of the above-described parameters, a control unit includes a battery management unit (BMU) and/or a battery management system (BMS). This control unit may be an integral part of the battery system, and may be disposed in a common housing or may be a part of a remote control unit that communicates with the battery system via an appropriate communication bus. The BMS or BMU may be connected not only to each battery module of the battery system, but also to one or more electricity consumer controllers. In general, each battery module may include a cell supervision circuit (CSC) configured to maintain communication with the BMS/BMU and a different battery module. The CSC may be further configured to monitor a cell voltage of the battery cells of some or each battery module, and to actively or passively balance the voltage of individual battery cells in the module.

As described above, embodiments may provide a battery system and a control method of the battery system, which may prevent invalid cell balancing. Embodiments may also provide a control method of a battery system, and the battery system, which is balanced (top-balanced, mid-balanced, or bottom-balanced) in an equalization target range (an equalization target voltage range or an equalization target SoC range). Embodiments may provide increased balancing efficiency. Embodiments may maximize a capacity of a battery that is transferred to a load.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A battery system, comprising:
a battery module that includes a plurality of battery cells;
a monitoring unit configured to monitor a parameter of each of the battery cells; and
a control unit configured to determine whether there is an abnormal battery cell in the battery module using the parameter, to calculate a reference voltage for balancing the battery cells when it is determined that there is an abnormal battery cell in the battery module, and to control cell balancing of the battery cells to an equalization target range,
wherein the control unit determines a battery cell having a minimum voltage other than the abnormal battery cell among the battery cells in the battery module as a reserved battery cell, and calculates the reference voltage using a state of charge difference between the reserved battery cell and the abnormal battery cell in the equalization target range.

2. The battery system of claim 1, wherein the abnormal battery cell is at least one of a weak battery cell, a high-impedance battery cell, and an internal short circuit battery cell.

3. The battery system of claim 1, wherein the equalization target range is one of a top-balancing range, a mid-balancing range, and a bottom-balancing range.

4. The battery system of claim 1, wherein the control unit determines whether there is a state of charge shift battery cell in the battery module using a state of charge calculated at two time points.

5. The battery system of claim 1, wherein the control unit determines whether there is a state of charge shift battery cell in the battery module by comparing an open circuit voltage that is measured during an idle period before charging or discharging with an open circuit voltage that is measured during an idle period after the charging or discharging.

6. The battery system of claim 1, wherein the control unit calculates capacity of each of the battery cells using the parameter, and determines whether there is a weak battery cell in the battery module by comparing the capacities.

7. The battery system of claim 1, wherein the control unit calculates a resistance value of each of the battery cells using the parameter, and determines whether there is a high-impedance battery cell in the battery module by comparing the resistance values.

8. The battery system of claim 1, wherein the control unit calculates the reference voltage using the following equations:

$$\Delta SOC_{ref} = (SOC_r - SOC_{CBGoal})|_{at\ CB\ Target\ Spot}$$
$$= (SOC_r - SOC_{min\ cell})|_{at\ charge\ cut\text{-}off}$$
$$\Delta V_{ref} = f(\Delta SOC_{ref}),\ \text{and}$$
$$V_{ref} = V_r - \Delta V_{ref}$$

wherein:
SoC$_r$, indicates a state of charge of the reserved battery cell,
SOC$_{CBGoal}$ indicates a state of charge of the battery cell having the minimum voltage in the equalization target range,
V$_r$ indicates a voltage of the reserved battery cell, and
V$_{ref}$ indicates the reference voltage.

9. The battery system of claim 8, wherein the control unit compensates the reference voltage depending on a time at which the cell balancing is performed.

10. The battery system of claim 9, wherein the control unit compensates the reference voltage using the following equations:

$$\Delta SOC_{ref} = (SOC_r - SOC_{CBGoal})|_{at\ CB\ Target\ Spot} - \Delta SOC_r|_{by\ cell\ balancing},$$
and
$$\Delta SOC_r|_{by\ cell\ balancing} = \frac{I_{CB} \cdot \Delta T_{CB\ On} \cdot \text{duty}_{CB}}{K \cdot Maxcap_r}$$

wherein:
I$_{CB}$ indicates a balancing current,
ΔT$_{CB\ On}$ indicates the time at which the cell balancing is performed, duty$_{CB}$ indicates a duty ratio of the cell balancing,
Maxcap$_r$ indicates capacity of the reserved battery cell, and K indicates a constant.

11. A method of controlling a battery system, comprising:
monitoring a parameter of each of a plurality of battery cells included in a battery module;
determining whether there is an abnormal battery cell in the battery module using the parameter;
calculating a reference voltage for balancing the battery cells when it is determined that there is an abnormal battery cell in the battery module; and
performing cell balancing to an equalization target range using the reference voltage,
wherein the calculating of the reference voltage includes:
determining a battery cell having a minimum voltage, other than the abnormal battery cell, among the battery cells in the battery module as a reserved cell; and
calculating the reference voltage using a state of charge difference between the reserved battery cell and the abnormal battery cell in the equalization target range.

12. The method of claim 11, wherein the determining of whether there is an abnormal battery cell includes determining whether there is a state of charge shift cell in the battery module using a state of charge calculated at any two time points.

13. The method of claim 11, wherein the determining of whether there is an abnormal battery cell includes determining whether there is a state of charge shift cell in the battery module by comparing an open circuit voltage that is measured during an idle period before charging or discharging with an open circuit voltage that is measured during an idle period after the charging or discharging.

14. The method of claim 11, wherein the determining of whether there is an abnormal battery cell in the battery module includes:
calculating a capacity of each of the battery cells in the battery module using the parameter; and
determining whether there is a weak battery cell in the battery module by comparing the capacities.

15. The method of claim 11, wherein the determining of whether there is an abnormal battery cell in the battery module includes:
calculating a resistance value of each of the battery cells in the battery module using the parameter; and
determining whether there is a high-impedance battery cell in the battery module by comparing the resistance values.

16. The method of claim 11, further comprising compensating the reference voltage depending on a time at which the cell balancing is performed.

17. The method of claim 11, wherein the abnormal battery cell is at least one of a weak battery cell, a high-impedance battery cell, and an internal short circuit battery cell.

18. The method of claim 11, wherein the equalization target range is one of a top-balancing range, a mid-balancing range, and a bottom-balancing range.

19. A battery system, comprising:
a battery module that includes a plurality of battery cells;
a monitoring unit configured to monitor a parameter of each of the battery cells; and
a control unit configured to determine whether there is an abnormal battery cell in the battery module using the parameter, to calculate a reference voltage for balancing the battery cells when it is determined that there is an abnormal battery cell in the battery module, and to control cell balancing of the battery cells to an equalization target range,
wherein the control unit determines whether there is a state of charge shift battery cell in the battery module by comparing an open circuit voltage that is measured during an idle period before charging or discharging with an open circuit voltage that is measured during an idle period after the charging or discharging.

20. The battery system of claim 19, wherein the control unit determines a battery cell having a minimum voltage other than the abnormal battery cell among the battery cells in the battery module as a reserved battery cell, and calculates the reference voltage using a state of charge difference between the reserved battery cell and the abnormal battery cell in the equalization target range.

\* \* \* \* \*